United States Patent
Gogoi et al.

(10) Patent No.: US 6,472,243 B2
(45) Date of Patent: Oct. 29, 2002

(54) METHOD OF FORMING AN INTEGRATED CMOS CAPACITIVE PRESSURE SENSOR

(75) Inventors: Bishnu P. Gogoi, Scottsdale; David J. Monk, Mesa; David W. Odle, Apache Junction; Kevin D. Neumann, Chandler; Donald L. Hughes, Jr., Mesa; John E. Schmiesing, Tempe; Andrew C. McNeil; Richard J. August, both of Scottsdale, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 29 days.

(21) Appl. No.: 09/734,473

(22) Filed: Dec. 11, 2000

(65) Prior Publication Data

US 2002/0072144 A1 Jun. 13, 2002

(51) Int. Cl.[7] ................................................. H01L 21/00
(52) U.S. Cl. .............................. 438/50; 438/22; 438/24; 438/45; 438/48; 438/53; 438/199; 257/414; 257/415
(58) Field of Search ............................ 438/22, 24, 45, 438/48, 50, 53, 200, 199; 257/414, 415; 73/715, 724, 754

(56) References Cited

U.S. PATENT DOCUMENTS

| | | | |
|---|---|---|---|
| 5,321,989 A | 6/1994 | Zimmer et al. | ................ 73/724 |
| 5,431,057 A | 7/1995 | Zimmer et al. | ................ 73/724 |
| 6,012,336 A | * 1/2000 | Eaton et al. | .................. 73/754 |

OTHER PUBLICATIONS

H. Dudaicevs et al., "A Fully Integrated Surface Micromachined Pressure Sensor With Low Temperature Dependence", The 8th International Conference on Solid–State Sensors and Actuators, and Eurosensors IX, Stockholm, Sweden, Jun. 25–29, 1995, pp. 616–619.

H. Dudaicevs et al., "Surface micromachined pressure sensors with integrated CMOS read–out electronics", Sensors and Actuators A, 43 (1994), pp. 157–163.

* cited by examiner

Primary Examiner—Wael Fabmy
Assistant Examiner—Hsien-Ming Lee
(74) Attorney, Agent, or Firm—Robert L. King (57) ABSTRACT

A capacitive pressure sensor (10) utilizes a diaphragm (38) that is formed along with forming gates (56,57) of active devices on the same semiconductor substrate (11).

12 Claims, 6 Drawing Sheets

METHOD OF FORMING AN INTEGRATED CMOS CAPACITIVE PRESSURE SENSOR

BACKGROUND OF THE INVENTION

The present invention relates, in general, to semiconductor devices and processing, and more particularly, to a monolithic pressure sensor integrated with CMOS circuitry.

In the past, the semiconductor industry has formed capacitive pressure sensors which are compatible with CMOS circuit elements and which permit integration within a CMOS circuit. Examples of such pressure sensors are given in U.S. Pat. Nos. 5,321,989 and 5,431,057 both of which issued under Gunther Zimmer et al, and also in a paper H. Dudaicevs et al, "A Fully Integrated Surface Micromachined Pressure Sensor with Low Temperature Dependence," $8^{th}$ Int. Conf. On Solid State Sensors and Actuators and Eurosensors IX, June 25–29, pp. 616–619, all of which are hereby incorporated herein by reference.

Typically, the pressure sensor has a fixed electrode which is formed as a doped portion within the substrate underlying the sensor diaphragm. Typically, the electrode area is doped by an implant that is performed at the same time as the source and drain implants of CMOS transistors that are formed within the same substrate. Thereafter, the (poly) silicon for the diaphragm is formed overlying the diffused electrode area. Subsequently, the polysilicon is implanted and annealed to dope the polysilicon. This annealing operation affects the source and drain implants of the CMOS devices and changes the characteristics of the resulting transistors. Consequently, the characteristics of the resulting CMOS transistors differ from the originally desired characteristics.

Accordingly, it is desirable to have a method of forming an integrated pressure sensor with CMOS transistors that does not detrimentally affect the CMOS transistor characteristics.

DETAILED DESCRIPTION OF THE DRAWINGS

In all the following descriptions of the drawings, the same reference numbers will be used in the drawings to represent the same elements.

Figure 1:
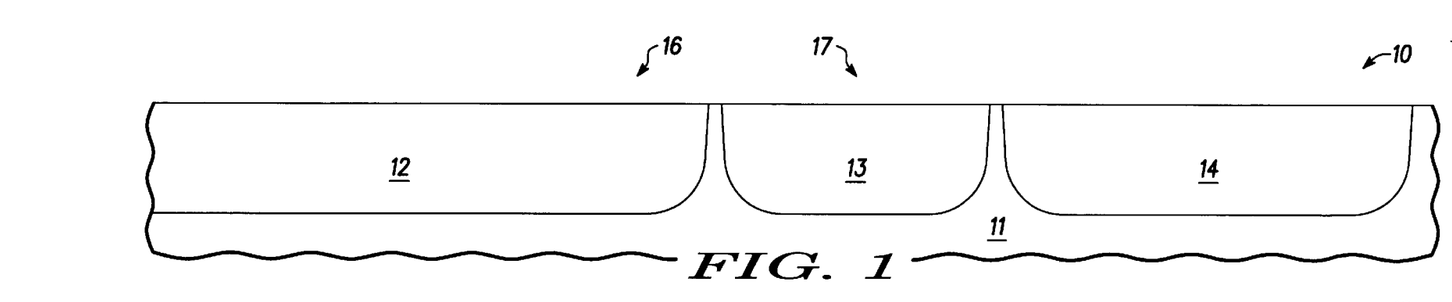
FIG. 1 schematically illustrates an enlarged cross-sectional portion of an embodiment of an integrated pressure sensor at an early fabrication stage in accordance with the present invention.

FIG. 1 schematically illustrates an enlarged cross-sectional portion of an integrated pressure sensor 10 that includes a pressure sensor and CMOS circuits built on a monolithic semiconductor substrate 11. Substrate 11 is formed of a first conductivity type and has a sensor portion or sensor area generally designated as 16 and a CMOS portion or CMOS area generally designated as 17. In the preferred embodiment, substrate 11 is P-type. Substrate 11 includes a first well area 12 or sensor well 12 and a second well area 13 both of the second conductivity type on a surface of substrate 11. Well areas 12 and 13 are formed by techniques that are well known to those skilled in the semiconductor art. In the preferred embodiment, well areas 12 and 13 are formed by oxidizing the surface of substrate 11 and utilizing a silicon nitride mask to expose portions of the surface of substrate 11 followed by implanting N-type dopants into the exposed portions of substrate 11 followed by an oxidation to form oxide layers overlying well areas 12 and 13. Thereafter in this preferred embodiment, the nitride mask is removed and dopants of the first conductivity type are implanted into the surface of substrate 11 in the area where third well area 14 is formed. Subsequently, the dopants of well areas 12, 13, and 14 are driven into substrate 11 to form well areas 12, 13, and 14. In this preferred embodiment, third well area 14 has a P-type doping that is five to one hundred times higher than that of substrate 11. Also in the preferred embodiment, well area 13 is often referred to as an N-type well 13 and well area 14 is referred to as a P-type well 14. AS will be seen in subsequent descriptions, well area 12 will function as an RF/EMI shield that minimizes variations in the capacitance of sensor 10 due to RF/EMI interference.

Figure 2:
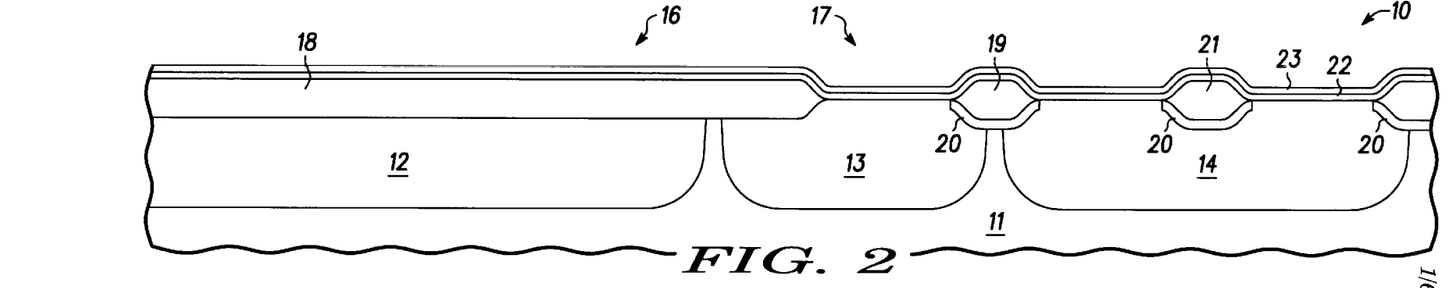
FIGS. 2–9 schematically illustrate the pressure sensor of FIG. 1 at subsequent fabrication stages in accordance with the present invention.

FIG. 2 schematically illustrates a subsequent stage of manufacturing sensor 10. A sensor isolation 18 is formed in the surface of substrate 11 overlying well area 12 and extending into well area 13. Isolation 18 will subsequently serve to isolate the pressure sensor from other CMOS circuitry formed in substrate 11. Isolation 18 can be a variety of isolation areas such as a field oxide area, an oxide or nitride layer deposited on substrate 11, a poly layer that is oxidized, or other isolations that are well known to those skilled in the art. Isolation 18 is formed in sensor area 16 of sensor 10. In the preferred embodiment, isolation 18 is a first field oxide. A well isolation field oxide 19 is formed in the surface of substrate 11 between well area 13 and well area 14 and a well isolation field oxide 21 is formed on the surface of substrate 11 and within well area 14. Field oxide 19 and accompanying field dopant 20 is used to isolate the CMOS transistors utilized in the CMOS devices formed in sensor 10 while field oxide 21 and accompanying field dopant 20 is utilized to isolate devices formed within well area 14. Field oxides 19, and 21 and field dopant 20 are formed by techniques that are well known to those skilled in the semiconductor art. Typically, isolation 18 is between 0.3 to 1.0 microns thick and preferably is about 0.75 microns.

In the preferred embodiment, isolation 18 or first field oxide 18, second field oxide 19 or well isolation field oxide 19, and third field oxide 21 or cell isolation field oxide 21 are formed simultaneously. Also, a P-type transistor subsequently formed in well area 14 is isolated from a subsequent EEPROM cell that is also formed in well 14. Subsequently, a thin blanket tunnel oxide layer 22 is applied covering isolation 18, field oxides 19 and 21, and the surface of well areas 13 and 14. In this preferred embodiment, layer 22 will subsequently be utilized to form an EEPROM cell within well area 14. Such tunnel oxide layers are formed by techniques that are well known to those skilled in the semiconductor art including oxidation in a nitrous oxide ($N_2O$) environment in order to accurately control the thickness of layer 22. Because of the thickness of isolation 18 and because formation of layer 22 is typically diffusion limited, layer 22 is generally very thin. Layer 22 has a thickness in the range of three to fifteen nanometers and preferably is about 0.5 to 1.0 nanometers. Thereafter, a floating gate blanket polysilicon layer 23 is applied covering layer 22.

In alternate embodiments, isolation 18 can be formed by forming a trench in substrate 11 so that the trench has a surface area sufficient for forming the diaphragm of sensor 10, typically about the area of isolation of the preferred embodiment. Thereafter, a thermal oxidation is performed to the insulation layer on the surface of the trench and extending up onto the substrate surface. Often, a chemical mechanical polishing or other technique is used to planarized the surface of substrate 11 following such oxidations.

Using the tunneling oxide, floating gate, gate oxide, or gate poly (discussed subsequently) formation steps to form the fixed electrode of sensor 10 facilitates the integration into a CMOS process flow and reduces the formation costs along with improving the device characteristics.

Figure 3:
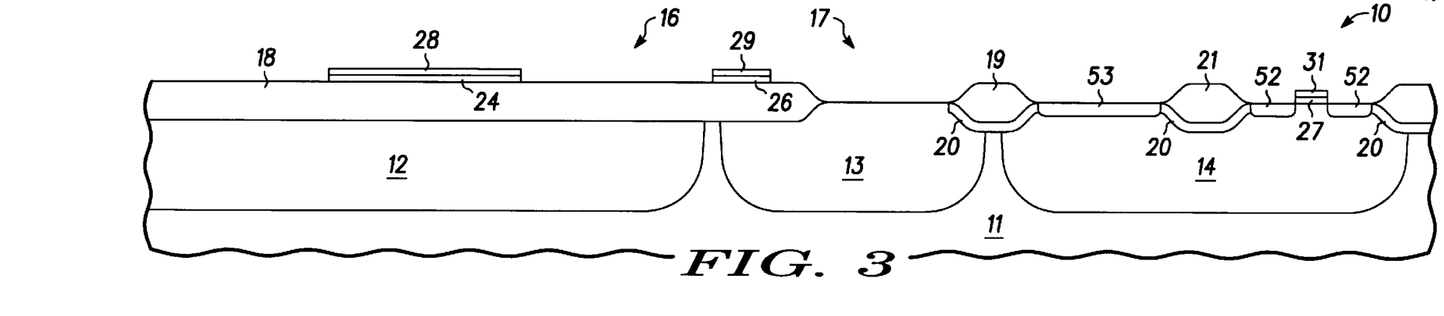

FIG. 3 illustrates sensor 10 after subsequent processing. Layers 23 and 22 (shown in FIG. 2) are patterned and etched to form a first doped polysilicon area 28 or fixed electrode 28 of sensor 10 on an electrode tunneling oxide area or first tunneling oxide area 24 that is on the surface of isolation 18. A contact polysilicon area 29 or sensor contact 29 and a contact tunneling oxide area 26 are concurrently formed on the surface of isolation 18 with electrode 28. Although not shown in FIG. 3, electrode 28 and sensor contact 29 are electrically continuous on the surface of isolation 18. As discussed in the description of FIG. 2, layer 22 over isolation 18 may be too thin to be detected or may even be non-existent. A floating gate area or second doped polysilicon area 31 is formed on a floating gate tunneling oxide layer 27 or second tunneling oxide area 27 concurrently with electrode 28 and sensor contact 29. The patterning and etching forms second tunneling oxide area 27 on the surface of substrate 11 adjacent field oxide 21. The patterning and etching steps utilized are well known to those skilled in the semiconductor art. It should also be noted that the conductive material of electrode 28 and contact 29 may be formed by separate steps such as forming and patterning a separate doped poly layer.

In the preferred embodiment, a mask is subsequently applied to facilitate implanting dopants into well 14 adjacent second doped poly area 31 to form doped regions 52. Regions 52 will be utilized as portions of an EEPROM cell that will be formed as a part of sensor 10. Typically, a gate oxide is formed covering sensor 10 and removed from sensor area 16 by techniques that are well known to those skilled in the art. Another mask is applied to facilitate the implanting of dopants as doped region 53 to adjust the threshold of the transistor to be formed in well 14 between field oxides 19 and 21.

Figure 4:
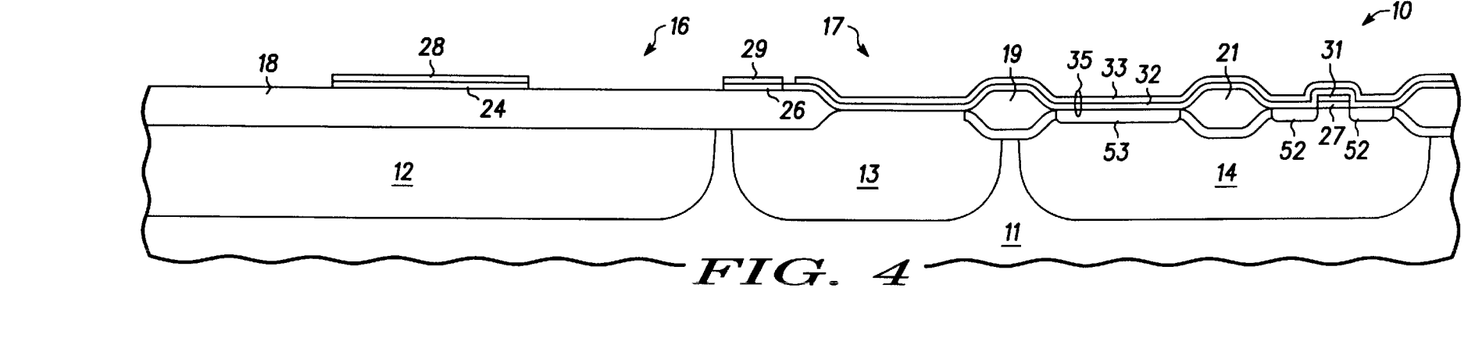

FIG. 4 illustrates sensor 10 at a subsequent stage after the formation of a protective layer 35 covering CMOS area 17 and extending into sensor area 16 up to sensor contact 29. Protective layer 35 includes a second polysilicon layer 32 and an etch stop layer 33 covering layer 32. Layers 32 and 33 are formed by a blanket deposition of polysilicon followed by a blanket deposition of the etch stop material followed by patterning and etching of both to remove the portions of layers 32 and 33 over portions of sensor area 16 thereby leaving protective layer 35, including layers 32 and 33, on the surface of well area 14 and area 31, extending over field oxide 21 and across well area 14 and over field oxide 19, across well area 13, and onto isolation 18 adjacent an edge of sensor contact 29. Layer 32 will subsequently be used to form gates of CMOS transistors. It should be noted that layer 32 can also be used to forum electrode 28 and contact 29 if the material of layer 32 therefor is doped to provide a conductor in the area for electrode 28 and contact 29. In the preferred embodiment, etch stop layer 33 is Tetraethylorthosilicate (TEOS).

Figure 5:
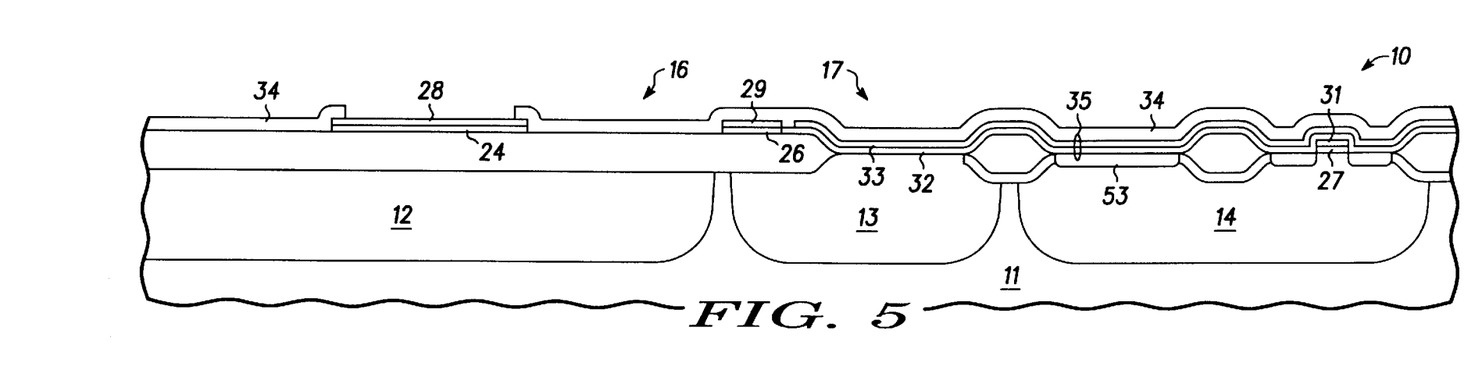

FIG. 5 illustrates the results of subsequent processing preformed on sensor 10. A sensor nitride layer 34 is formed on isolation 18 and overlapping onto the edges of electrode 28, and extending into CMOS area 17 overlying well areas 13 and 14 and overlying field oxides 19 and 21. In the preferred embodiment, nitride layer 34 is a low stress silicon-rich silicon nitride layer 34 formed by blanket deposition and subsequent patterning and etching that exposes electrode 28. Alternately, layer 34 can be a silicon nitride stochiometric layer.

Figure 6:
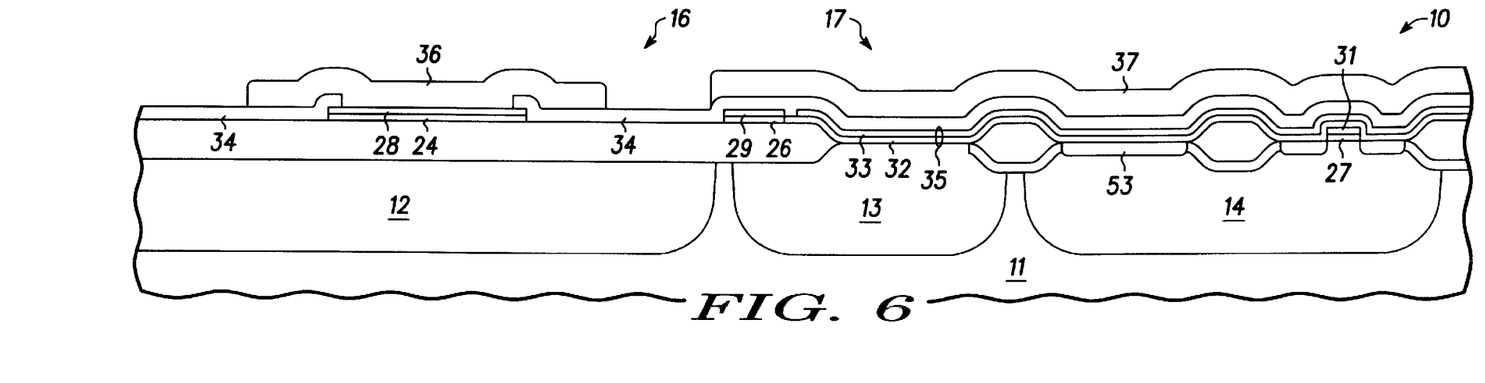

FIG. 6 illustrates sensor 10 after the subsequent formation of a sacrificial layer having a sensor area or first sacrificial layer portion 36 and a CMOS area or second sacrificial layer portion 37. First sacrificial layer portion 36 is formed on electrode 28 and extending out onto layer 34 and second sacrificial layer portion 37 is formed on the portion of layer 34 that overlays sensor contact 29 well areas 13 and 14, and field oxides 19 and 21. Sacrificial layer portions 36 and 37 are formed by methods that are well known in the semiconductor art, for example, by blanket deposition of PSG and subsequent patterning and etching. In the preferred embodiment, sacrificial layer portions 36 and 37 are phosphosilicate glass (PSG) followed by subsequent annealing prior to masking and etching. The thickness of first sacrificial layer portion 36 is used to determine the capacitor gap of the completed pressure sensor. Second sacrifical layer portion 37 will be utilized to facilitate protecting CMOS area 17 during subsequent formation of the sensor diaphragm. Multiple sacrificial layers may be used to form portions 36 and 37. In the preferred embodiment, portions 36 and 37 have a thickness of 0.2 to 1.0 microns.

Figure 7:
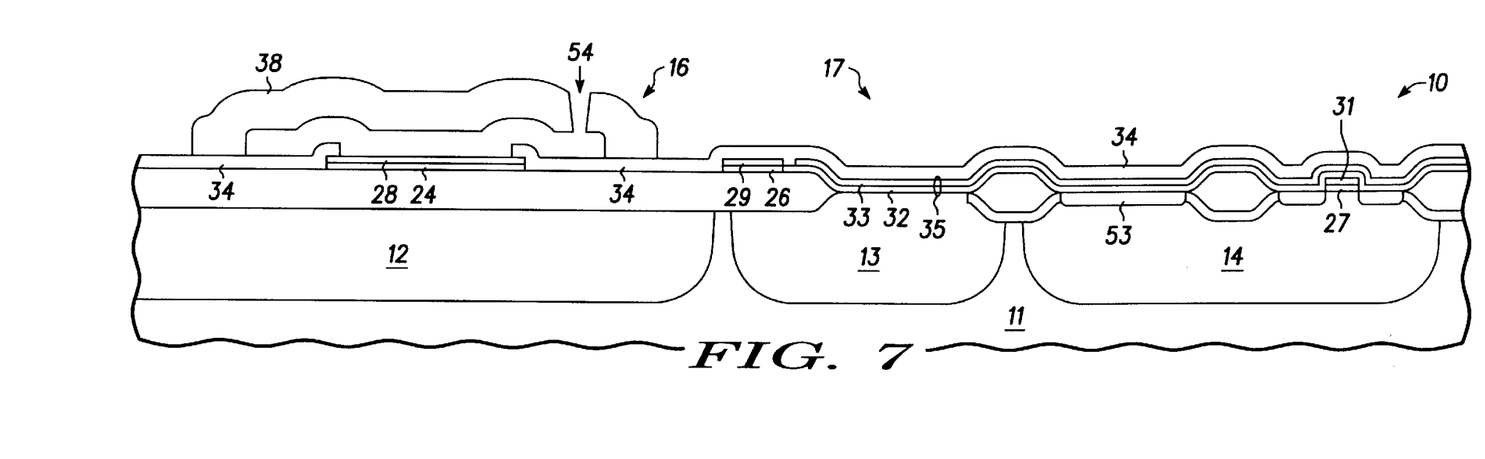

Referring to FIG. 7 sensor 10 is illustrated at a subsequent manufacturing stage after the formation of a pressure sensor diaphragm 38 overlying fixed electrode 28. In the preferred embodiment, diaphragm 38 is formed by first applying a blanket deposition of polysilicon onto the surface of sensor 10 followed by implanting dopants to form a doped polysilicon layer. A mask is then applied to protect diaphragm 38 that is to remain on sensor 10 while removing other portions of the polysilicon layer that is on second sacrificial layer portion 37 and on portions of layer 34. The mask has an opening overlying diaphragm 38 so that during the removal of the exposed polysilicon layer an etch release opening 54 is formed through diaphragm 38 exposing the underlying surface of first sacrificial layer portion 36. Typically, the etch utilized to remove the exposed polysilicon does not affect sacrificial layer portions 36 or 37 (shown in FIG. 6).

Thereafter, a release etch is performed that removes first sacrificial layer portion 36 that is underlying diaphragm 38 and also removes second sacrificial layer portion 37 from the remaining surface of sensor 10. The material used in the release etch does not affect the underlying layer 34 which functions as an etch stop during this operation thereby protecting the remaining surface of sensor 10 including the surface of CMOS area 17. Methods of forming diaphragm 38 and removing sacrificial layer portions 36 and 37 (shown in FIG. 6) are well known to those skilled in the semiconductor art. The use of the preferred embodiment of low stress nitride under diaphragm 38 reduces stresses applied to diaphragm 38 thereby facilitating the formation of a diaphragm having a large surface area or an undercut distance at the release etch of greater than one hundred microns.

Using a layer 34 thickness of 0.2 to 1.0 microns facilitates such an undercut distance. In the preferred embodiment, diaphragm 38 is formed with a compressive stress, with a thickness of one to three microns, and may be formed from multiple layers.

Figure 8:
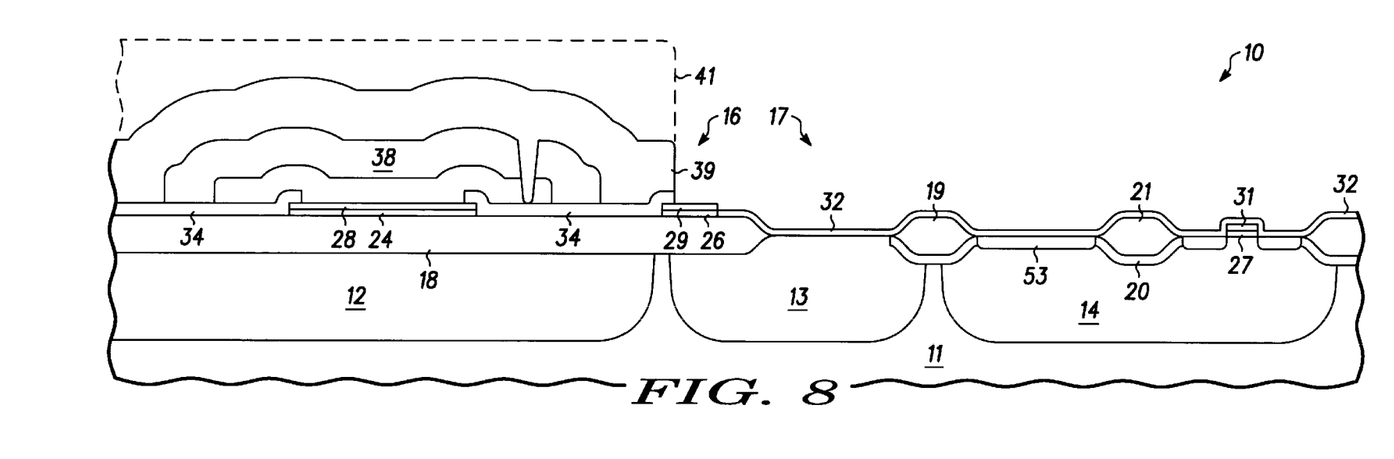

FIG. 8 illustrates a subsequent manufacturing stage of sensor 10 wherein a sealing layer 39 is applied to seal diaphragm 38. The material may be any of those materials typically used for sealing sensor diaphragms. Typically layer 39 is formed by applying a blanket deposition of TEOS using a non-conformal or line of sight deposition so that there is no lateral encroachment of the deposited TEOS. After the blanket deposition, unwanted portions of the sealing material are removed by applying a mask to protect layer 39, as indicated by a dashed line 41, while removing the sealing material from CMOS area 17 and from sensor contact 29. For example, a buffered oxide etch may be utilized to remove the unwanted portions of the sealing material. In the preferred embodiment, layer 39 has a thickness of about one to four microns. Also, other materials such as PSG, plasma enhanced nitride, and oxynitride can be used for layer 39.

The mask is removed and the portion of layer 34 is removed from CMOS area 17 and from sensor contact 29. This leaves diaphragm 38 and sealing layer 39 residing in contact with layer 34. Following the removal of layer 34, a blanket etch is utilized to remove etch stop layer 33. In the preferred embodiment, a buffered oxide etch is utilized to remove the TEOS used for etch stop layer 33.

Figure 9:
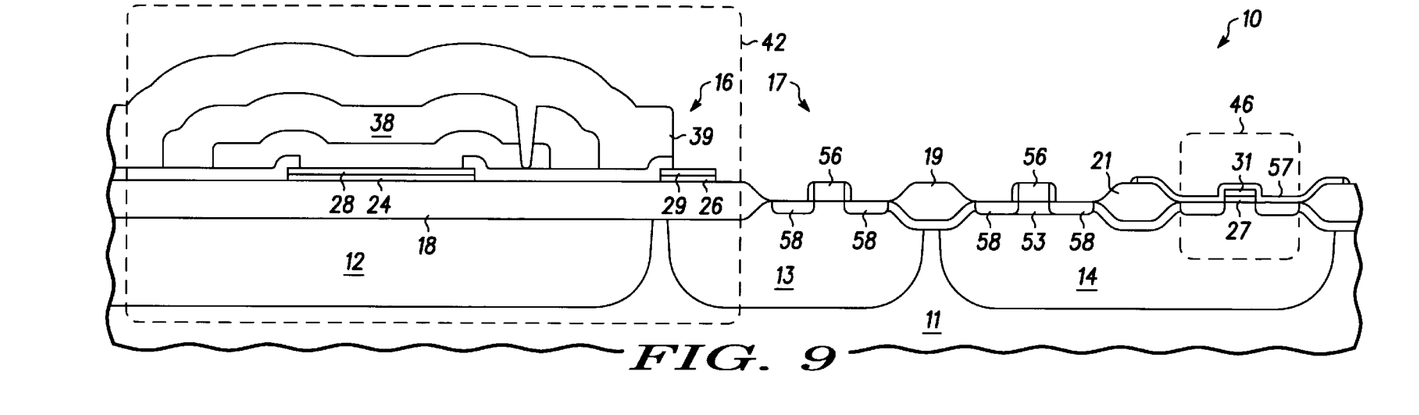

FIG. 9 illustrates sensor 10 after several subsequent processing operations are performed. In the preferred embodiment, a memory cell or EEPROM cell identified by a dashed box 46 is formed in well area 14, and N and P CMOS transistors are formed in well areas 13 and 14 respectively. Subsequent to removing protective layer 35 as described in the explanation of FIG. 8, the exposed protective poly layer 32 is patterned and etched to form transistor gates 56 and an active gate 57 of the EEPROM cell. Gates 56 will become the gates of CMOS transistors of transistors 43 and 44 (shown generally by dashed boxes) that will be formed in well areas 13 and 14. The formation of transistor gates 56 and active gate 57 are well known to those skilled in the art.

Thereafter, sensor 10 is masked and source and drain implant areas 58 are formed adjacent transistor gates 56 in well areas 13 and 14. As is well known in the art, implant areas 58 may be a combination of implants to form graded source and drain areas. In the preferred embodiment, nitride spacers are formed adjacent transistor gates 56 to protect gates 56 during subsequent silicidization of gate 56. Such spacers and silicidization operations and methods are well known to those skilled in the semiconductor art. Subsequently, an activation anneal is performed in order to activate the dopants in implant areas 58. In the preferred embodiment, the activation anneal is a rapid thermal process performed at a temperature between 900 and 1100 degrees Celsius for a time of twenty to forty seconds. This activation also activates the dopant in diaphragm 38 and relieves stresses that are formed in diaphragm 38. Performing the activation anneal for the source drain implants and for the doped polysilicon of the diaphragm at the same time prevents the activation anneal of the diaphragm polysilicon from affecting the characteristics of the CMOS transistors. Thus a pressure transducer 42, shown by a dashed box, is formed on sensor 10.

Figure 10:
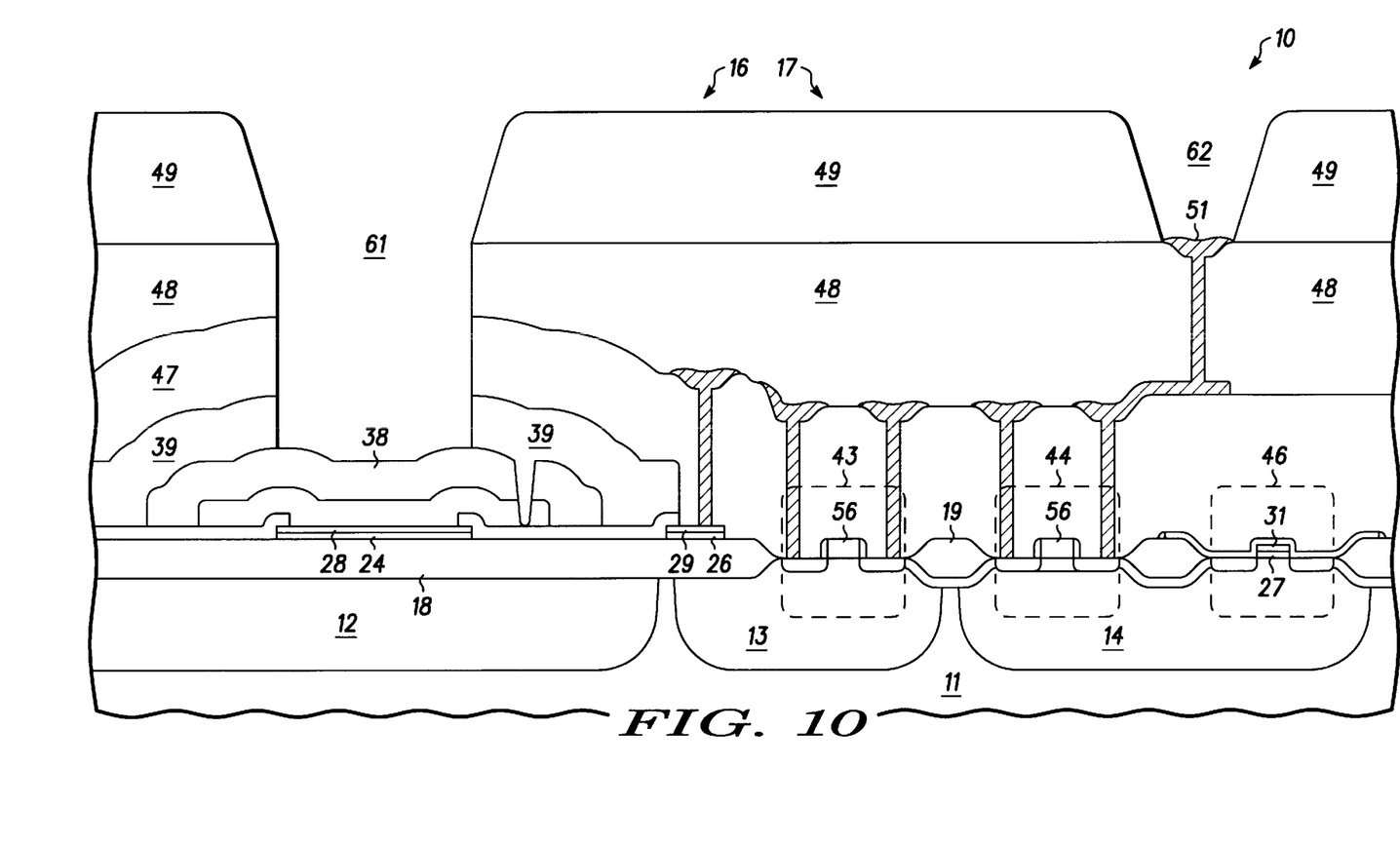
FIG. 10 schematically illustrates an enlarged cross-sectional portion of the integrated pressure sensor of FIGS. 1–9 subsequent to forming a passivation layer and pressure sensor ports in accordance with the present invention.

FIG. 10 illustrates sensor 10 after forming multiple layers of metal interconnects and a passivation layer 49 protecting sensor 10. A first interlayer dielectric 47 and associated metal interconnects and a second interlayer dielectric 48 and a device electrode 51 are formed by techniques that are well known to those skilled in the semiconductor art. Methods for forming passivation layer 49 overlying sensor 10 are well known to those skilled in the semiconductor art. Subsequently, portions of passivation layer 49 are removed to expose device electrode 51 and diaphragm 38. Typically passivation layer 49 is a layer of oxynitride however a variety of well known passivation materials may be used including silicon dioxide.

In one embodiment, a mask is applied to passivation layer 49 and patterned to have openings corresponding to where a sensor opening 61 and a contact opening 62 are to be formed. A wet buffered oxide etch (BOE) is utilized to remove the exposed portions of passivation layer 49. The etch is stopped prior to exposing the metal of device electrode 51 in order to prevent the BOE from staining the metal of contact 51. Thereafter, a dry etch is utilized to expose contact 51 and to remove the dielectrics overlying diaphragm 38 and sealing layer 39. This dry etch must stop upon exposing diaphragm 38 in order to prevent etching or damaging diaphragm 38.

As is well known in the art, another pressure transducer similar to transducer 42 is formed on a portion of sensor 10 distal to transducer 42 in order to form a differential capacitor sensor.

In an alternate embodiment, opening 61 may be formed in dielectric 47 and the underlying portion of sealing layer 39 removed at the same time that openings are formed for the metal contacts that go through dielectric 47. In this embodiment, it is important to remove all metal that is formed overlying diaphragm 38 on dielectric 47 in order to prevent the metal from affecting the capacitance of sensor 10. Thereafter, opening 61 would be formed in dielectric 48 simultaneously with forming the opening for the metal of contact 51. All metal would also have to be removed on the surface of dielectric 48 that overlies diaphragm 38. Thereafter, opening 61 would be formed in passivation layer 49 simultaneously with the formation of opening 62.

In another alternate embodiment, a mask is applied exposing the area of passivation layer 49 where openings 61 and 62 are to be formed. A dry etch is utilized to form opening 61 and 62 through layer 49 and to continue down through dielectrics 48 and 47 to expose sealing layer 39. Another mask is applied to protect opening 62 and expose opening 61 during a wet etch used to remove the material of sealing layer 39 thereby exposing diaphragm 38.

Figure 11:
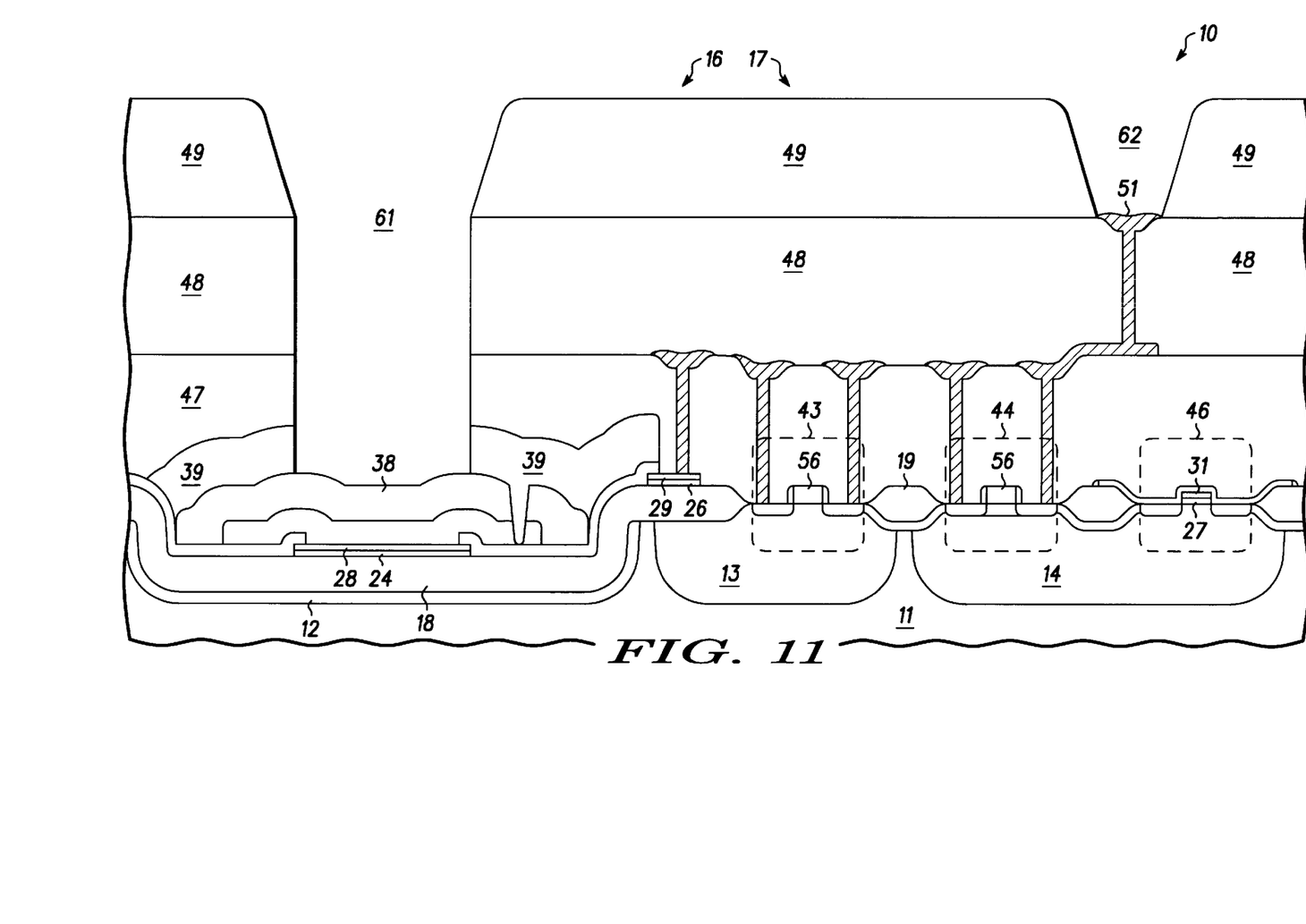
FIG. 11 schematically illustrates an enlarged cross-sectional portion of another embodiment of an integrated pressure sensor in accordance with the present invention.

FIG. 11 illustrates an alternate embodiment of sensor 10 that provides sensor 10 with a more planar surface by recessing the diaphragm and sealing layer to a level that is more planar with the surface provided by transistors 43 and 44. In this embodiment, a recess or moat is formed in well area 12 prior to the formation of field oxide 18. The moat within well area 12 may be formed by various well known techniques, for example anisotropic etching, that create V-shaped or sloping sides to make subsequent processing steps easier to perform.

In another alternative embodiment, a mask is applied exposing the area of passivation layer 49 where opening 62 is formed. A dry etch is used to form opening 61. Another mask is then applied to expose the area of passivation where opening 61 is formed. A wet etch is then utilized to remove the materials in layer 49, layer 48, layer 47, and layer 39 exposing diaphragm 38.

By now it should be appreciated that there has been provided a novel integrated pressure sensor and method therefore. Forming the diaphragm and fixed electrode on an isolation layer such as field oxide isolates the diaphragm and fixed electrode from the CMOS and other active elements of sensor 10. Forming the fixed electrode on a thin oxide layer simultaneously with the floating gate electrode of an EEPROM cell minimizes the processing steps required to form the fixed electrode. Forming the doped polysilicon diaphragm prior to implanting source and drain areas of the CMOS transistors and annealing the polysilicon diaphragm along with the source and drain implants insures that the annealing of the polysilicon diaphragm does not detrimentally affect the characteristics of the CMOS transistors.

What is claimed is:

1. A method of forming an integrated CMOS pressure sensor comprising:
    forming a semiconductor substrate of a first conductivity type having a sensor area and a CMOS area;
    forming a sensor diaphragm overlying a fixed electrode of the sensor that is overlying a sensor isolation, the fixed electrode being formed on a first portion of a tunneling oxide layer wherein a floating gate of a device in the CMOS area being formed on a second portion of the tunneling oxide layer;
    subsequently forming source and drain areas of CMOS transistors in a surface of the semiconductor substrate; and within the CMOS area of the semiconductor substrate prior to annealing the sensor diaphragm; and
    annealing the sensor diaphragm and the source and drain areas.

2. The method of claim 1 wherein forming the sensor diaphragm includes forming the sensor diaphragm from doped polysilicon that is overlying the fixed electrode and the sensor isolation.

3. The method of claim 1 wherein the floating gate of the device in the CMOS area is a floating gate of a memory cell.

4. A method of forming a semiconductor pressure sensor comprising:
    forming a semiconductor substrate of a first conductivity type having a sensor area and a CMOS area;
    forming a sensor isolation in the sensor area and a field oxide area on a surface of the semiconductor substrate in the CMOS area wherein the sensor isolation is spaced apart from the field oxide area;
    forming a first doped polysilicon area overlying the sensor isolation as an electrode area while forming a second doped polysilicon area as a floating gate area in the CMOS area;
    forming a sensor diaphragm of doped polysilicon overlying the first doped polysilicon area and a sealing layer overlying the sensor diaphragm, wherein the second doped polysilicon area is protected while forming the sensor diaphragm and the sealing layer; and
    subsequently implanting and annealing source and drain areas in the surface of the CMOS area of the semiconductor substrate.

5. The method of claim 4 further including forming a first tunneling oxide layer on a portion of the sensor isolation and a second tunneling oxide layer on the surface of the semiconductor substrate adjacent the field oxide area.

6. The method of claim 4 wherein forming the semiconductor substrate includes forming the semiconductor substrate having a first well area of a second conductivity type, a second well area of the second conductivity type, and a third well area of the first conductivity type wherein the first, second and third well areas are formed on a surface of the semiconductor substrate.

7. The method of claim 6 wherein forming a first field oxide area includes forming the first field oxide area overlying a portion of the first well area and the second well area, and a second field oxide area adjacent the second and third well areas.

8. The method of claim 7 further including forming a doped area in the third well area adjacent the floating gate portion of the tunneling oxide layer;
    forming a protective layer having a sensor area on a portion of the first field oxide area and having a CMOS area on the second well area, on the second field oxide layer, on the third well area, and on the floating gate portion of the doped polysilicon layer;
    forming a low stress nitride layer having a sensor area on a portion of the first field oxide area and overlapping onto the electrode portion of the doped polysilicon, and having a CMOS area on the second well area, on the second field oxide layer, on the third well area, and on the second floating gate portion of the doped polysilicon layer; and
    forming a sacrificial layer having a first portion on the electrode portion of the doped polysilicon layer and a second portion on the second well area, on the second field oxide layer, on the third well area, and on the second floating gate portion of the doped polysilicon layer.

9. The method of claim 8 wherein forming the pressure sensor diaphragm comprises forming a polysilicon layer on the low stress nitride layer and covering the first portion of the sacrificial layer;
    removing the first portion and the second portion of the sacrificial layer;
    applying a sealing layer on the diaphragm polysilicon layer; and
    removing the low stress nitride layer of the CMOS area.

10. The method of claim 8 wherein implanting and annealing source and drain areas includes implanting source and drain areas in the third well area for forming a floating gate of a memory cell in the third well area and overlying the second portion of the tunneling oxide layer, and implanting source and drain areas in the second well area for forming a CMOS transistors in the second well area.

11. A method of forming a semiconductor pressure sensor comprising:
    forming a substrate of a semiconductor material of a first conductivity type, the substrate having a first well area of a second conductivity type, a second well area of the second conductivity type, and a third well area of the first conductivity type wherein the first, second and third well areas are formed on a surface of the substrate;
    forming a first field oxide area overlying a portion of the first well area and the second well area, and a second field oxide area adjacent the second and third well areas;
    forming a doped polysilicon layer having an electrode portion overlying the first field oxide area and having a floating gate portion overlying the third well area;
    forming a doped area in the third well area adjacent the floating gate portion of the tunneling oxide layer;
    forming an etch stop layer having a sensor area on a portion of the first field oxide area and having a CMOS area on the second well area, on the second field oxide layer, on the third well area, and on the floating gate portion of the doped polysilicon layer;
    forming a low stress nitride layer having a sensor area on a portion of the first field oxide area and overlapping onto the electrode portion of the doped polysilicon, and having a CMOS area on the second well area, on the second field oxide layer, on the third well area, and on the second floating gate portion of the doped polysilicon layer;

forming a sacrificial layer having a first portion on the electrode portion of the doped polysilicon layer and a second portion on the second well area, on the second field oxide layer, on the third well area, and on the second floating gate portion of the doped polysilicon layer;

forming a diaphragm polysilicon layer on the low stress nitride layer and covering the first portion of the sacrificial layer;

removing the first portion and the second portion of the sacrificial layer;

applying a sealing layer on the diaphragm polysilicon layer;

removing the low stress nitride layer of the CMOS area;

implanting source and drain areas in the third well area for forming a floating gate CMOS in the third well area and overlying the second portion of the tunneling oxide layer, and implanting source and drain areas in the second well area for forming a CMOS in the second well area; and annealing the source and drain areas.

12. The method of claim 11 wherein forming the doped polysilicon layer includes forming a tunneling oxide layer having a first portion on a portion of the first field oxide area and a second portion of the tunneling oxide layer on a portion of the third well area.

* * * * *